(12) United States Patent
Nagarajan

(10) Patent No.: US 6,911,736 B2
(45) Date of Patent: Jun. 28, 2005

(54) ELECTROSTATIC DISCHARGE PROTECTION

(75) Inventor: Kumar Nagarajan, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/456,281

(22) Filed: Jun. 6, 2003

(65) Prior Publication Data

US 2004/0245632 A1 Dec. 9, 2004

(51) Int. Cl.⁷ .............................................. H01L 23/52
(52) U.S. Cl. ....................... 257/737; 257/738; 257/700; 257/698; 257/758; 257/690; 257/786; 361/760; 361/764; 361/773
(58) Field of Search ................................. 257/690, 698, 257/700, 758, 737, 738, 665, 786, 355, 778, 780, 691, E23.171, 48; 361/760, 764, 773, 820; 438/107, 108, 128, 130, 131

(56) References Cited

U.S. PATENT DOCUMENTS 5,763,947 A * 6/1998 Bartley ........................ 257/701
6,407,450 B1 * 6/2002 Verma et al. ............... 257/697

* cited by examiner

Primary Examiner—Tom Thomas
Assistant Examiner—Matthew C Landau
(74) Attorney, Agent, or Firm—Luedeka, Neely & Graham, P.C.

(57) ABSTRACT

A package substrate that is adapted to receive at least one subject integrated circuit having a subject contact pattern, where the subject integrated circuit is selected from a design set of integrated circuits. The package substrate has an upper surface with electrically conductive bump contacts in a bump array. The bump array is configured to provide electrical connections to all possible integrated circuit contact patterns in the design set of integrated circuits. A lower surface of the package substrate has electrically conductive ball contacts in a ball array. One each of the bump contacts is electrically connected to one each of the ball contacts through the package substrate. An electrically conductive ground plane is disposed between the upper surface and the lower surface. Grounding contacts are disposed adjacent the ball contacts, where the grounding contacts are electrically connected to the ground plane. The grounding contacts are adapted to electrically short a given ball contact to the ground plane when the bump contact electrically connected to the given ball contact is not used by the subject contact pattern of the subject integrated circuit.

16 Claims, 1 Drawing Sheet

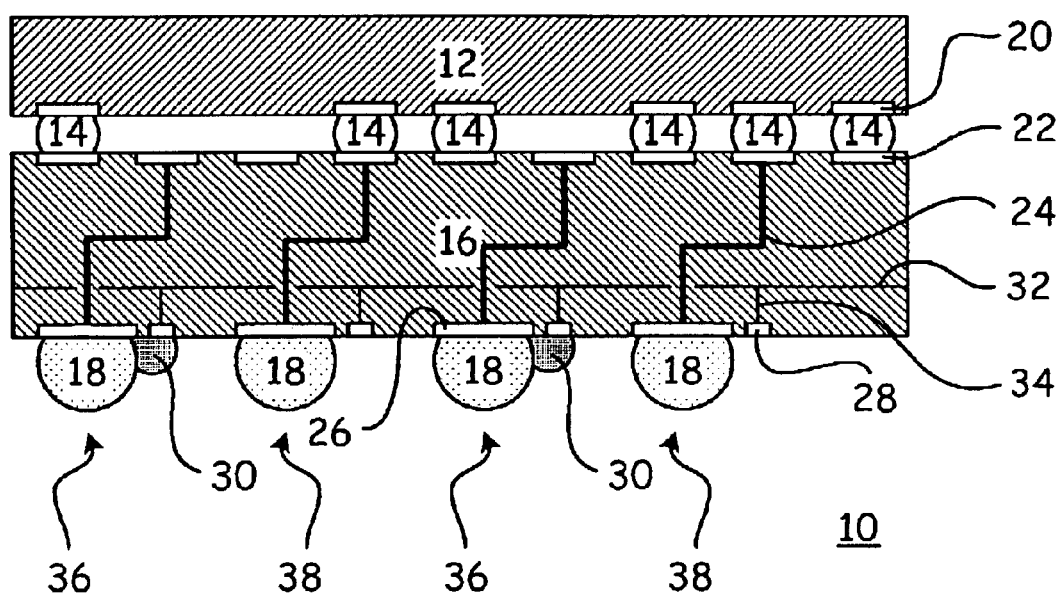

ELECTROSTATIC DISCHARGE PROTECTION

FIELD

This invention relates to the field of integrated circuit fabrication. More particularly, this invention relates to a package substrate design that reduces electrical problems that can occur when an integrated circuit does not make use of all of the contacts on the package substrate.

BACKGROUND

Electrostatic discharge typically occurs when bodies at different electrical potentials are brought toward each other. The distance between the two bodies at which the discharge occurs is variable, depending upon a number of factors, such as the potential difference between the two bodies, the materials of which the bodies are formed, and the conductivity of the medium between them. It is not uncommon, under various circumstances, for the potential difference to be as great as about twenty-five thousand volts. However, because the amount of current that flows from one body to the next during such a discharge is typically extremely low, an electrostatic discharge is usually not harmful to a person.

However, an electrostatic discharge of even a much lower voltage difference can be extremely damaging to an integrated circuit, despite the low current flow. Because the structures of which an integrated circuit is formed are so small, an electrostatic discharge through an integrated circuit, which is typically designed to operate at about five volts, can easily physically damage the integrated circuit. Such damage can make the integrated circuit either unreliable or wholly inoperable. Thus, the reduction of the propensity for electrostatic discharge through an integrated circuit is an important goal in the microelectronics industry.

One situation where electrostatic discharge is a problem is where there is an electrically conductive contact that is open, or in other words, is not used, such as not being electrically connected to another element. Such a situation can occur, for example, when a standardized package substrate is used for mounting a variety of different integrated circuit designs. By using a single package substrate design for many different integrated circuit designs, the number of package substrate designs can be reduced, which yields various cost savings.

Because it is desirable to use just a single standardized package substrate design for a variety of different integrated circuit designs, the package substrate is fabricated to have electrically conductive contacts at all positions required by all of the different integrated circuit designs. However, not all of the different integrated circuit designs have electrically conductive contacts in the same positions. Thus, when a given integrated circuit is mounted on the standardized package substrate, there are typically many contacts on the package substrate that are left without any electrical connection to the integrated circuit.

These unused electrical connections on the package substrate often act as tiny antennas or lightening rods, and tend to either accumulate charge or serve as points for electrostatic discharge. As mentioned above, such electrostatic discharge tends to damage the packaged integrated circuit, or other elements of the circuit.

What is needed, therefore, is a system for reducing the occurrence of electrostatic discharge through a package substrate, such as into an integrated circuit.

SUMMARY

The above and other needs are met by a package substrate that is adapted to receive at least one subject integrated circuit having a subject contact pattern, where the subject integrated circuit is selected from a design set of integrated circuits. The package substrate has an upper surface with electrically conductive bump contacts in a bump array. The bump array is configured to provide electrical connections to all possible integrated circuit contact patterns in the design set of integrated circuits. A lower surface of the package substrate has electrically conductive ball contacts in a ball array. One each of the bump contacts is electrically connected to one each of the ball contacts through the package substrate. An electrically conductive ground plane is disposed between the upper surface and the lower surface. Grounding contacts are disposed adjacent the ball contacts, where the grounding contacts are electrically connected to the ground plane. The grounding contacts are adapted to electrically short a given ball contact to the ground plane when the bump contact electrically connected to the given ball contact is not used by the subject contact pattern of the subject integrated circuit.

In this manner, a low cost, generic or standardized package substrate design can be used with a variety of integrated circuit designs, while reducing the incidence of electrostatic discharge within the packaged device. In the past, such generic package substrates would inevitably have contacts and associated circuitry that would not be electrically connected to the integrated circuit, or often anything else, and thus would act as antennas for the accumulation and eventual discharge of a voltage potential. However, by electrically connecting such unused circuitry to the ground plane, especially by conveniently using the ball contacts as described herein, such unused circuitry is grounded and any voltage potential that might have otherwise built up on the unused circuitry is continually discharged through the ground plane. Thus, large and potentially damaging voltage potentials from these sources are reduced or eliminated.

In various preferred embodiments of the invention, the grounding contacts are smaller than the ball contacts. Preferably, the grounding contacts are between about one hundred microns and about two hundred microns in diameter. The grounding contacts are preferably electrically connected to the ground plane with electrically conductive via in pad connections. Preferably, the grounding contacts are disposed from the ball contacts at a distance of between about two hundred microns and about three hundred microns. There is preferably one each of the grounding contacts associated with one each of the ball contacts. The package substrate preferably includes ground and power bump contacts on the upper surface, and ground and power ball contacts on the lower surface. The ground plane is preferably electrically connected to both the ground bump contacts and the ground ball contacts. Also described is a packaged integrated circuit including the package substrate as described above.

According to another aspect of the invention there is described a packaged integrated circuit, including a subject integrated circuit having a subject contact pattern. The subject integrated circuit is selected from a design set of integrated circuits. Also included is a package substrate, which is adapted to receive the subject integrated circuit. The package substrate has an upper surface having electrically conductive bump contacts in a bump array. The bump array is configured to provide electrical connections to all possible integrated circuit contact patterns in the design set of integrated circuits. A lower surface on the package substrate has electrically conductive ball contacts in a ball array. One each of the bump contacts is electrically connected to one each of the ball contacts through the package substrate. An electrically conductive ground plane is disposed between the upper surface and the lower surface. Grounding contacts are disposed adjacent the ball contacts, where the grounding contacts are electrically connected to the ground plane. The grounding contacts are adapted to electrically short a given ball contact to the ground plane when the bump contact electrically connected to the given ball contact is not used by the subject contact pattern of the subject integrated circuit.

According to a further aspect of the invention there is described a method of packaging an integrated circuit with a package substrate to produce a packaged integrated circuit, in a manner so as to reduce the incidence of electrostatic discharge within the packaged integrated circuit. Contacts-on the integrated circuit are electrically connected to electrically conductive bump contacts in a bump array on an upper surface of the package substrate. A portion of the bump contacts in the bump array have no corresponding contacts on the integrated circuit to make electrical connections with. The bump contacts in the bump array are electrically connected to electrically conductive ball contacts in a ball array on a lower surface of the package substrate. One each of the bump contacts is electrically connected to one each of the ball contacts through the package substrate. The ball contacts that are electrically connected to the portion of the bump contacts that have no corresponding contacts on the integrated circuit are electrically connected to an electrically conductive ground plane disposed between the upper surface and the lower surface of the package substrate, through grounding contacts disposed adjacent the ball contacts.

In various preferred embodiments, the ball contacts that are electrically connected to the portion of the bump contacts that have no corresponding contacts on the integrated circuit are electrically connected to the electrically conductive ground plane through grounding contacts disposed adjacent the ball contacts on the lower surface of the package substrate. Preferably, the grounding contacts are disposed at a distance of between about two hundred microns and about three hundred microns from the ball contacts. The grounding contacts are preferably between about one hundred microns and about two hundred microns in diameter. Preferably, the step of electrically connecting the ball contacts to the grounding contacts is accomplished by enlarging holes for the ball contacts in a solder mask, thereby allowing solder bridging to occur between the ball contacts and the grounding contacts.

BRIEF DESCRIPTION OF THE DRAWINGS

Further advantages of the invention are apparent by reference to the detailed description when considered in conjunction with the FIGURE, which is not to scale so as to more clearly show the details, wherein like reference numbers indicate like elements, and which depicts a cross sectional view of a packaged integrated circuit, with an integrated circuit, bump connections, a package substrate, and ball connections.

DETAILED DESCRIPTION

With reference now to the FIGURE, there is depicted a cross sectional view of a portion of a packaged integrated circuit 10, with an integrated circuit 12, electrically conductive solder bumps 14, a package substrate 16, and electrically conductive solder balls 18. The integrated circuit 12 preferably makes electrical connections with the solder bumps 14 such as through electrically conductive contacts 20. Similarly, the package substrate 16 preferably makes electrical connections with the solder bumps 14 such as through electrically conductive contacts 22, which are disposed in a bump array on a first surface of the package substrate 16, generally referred to as the upper surface of the package substrate 16 herein.

As can be seen in the FIGURE, the contacts 20 on the integrated circuit 12 are electrically connected to some of the contacts 22 on the package substrate 16. However, not all of the contacts 22 on the package substrate 16 are electrically connected to a corresponding contact 20 on the integrated circuit 12. As described above, one reason for this is that the package substrate 16 is preferably a generic or standardized package substrate 16, which is designed to receive a variety of different integrated circuit designs, some of which designs have contacts 20 in different locations than others of the designs. These unconnected or unused electrical contacts 22 that tend to accumulate and then discharge a voltage potential as an electrostatic discharge.

Preferably, the contacts 22 are electrically connected to electrically conductive contacts 26 disposed in a ball array on an opposing surface of the package substrate 16, generally referred to as the lower surface of the package substrate 16 herein. The contacts 26 are preferably electrically connected to electrically conductive solder balls 18, which are used for electrically connecting the packaged integrated circuit 10 to external circuitry.

The contacts 22 are preferably electrically connected to the contacts 26 such as by electrically conductive lines 24. The lines 24 may include relatively complex systems of electrically conductive vias and traces on many different levels of the package substrate 16, all of which various combinations are not depicted so as to not overly complicate the figure with details that are less important for a full understanding of the invention. Thus, the lines 24 are relatively simply depicted in the FIGURE. It is further appreciated that not all such lines 24 are depicted for all of the contacts 22 of the package substrate, which again has been done so as to not overly complicate the FIGURE.

Thus, as depicted, some sets 36 of a contact 22, line 24, contact 26, and solder ball 18 are not electrically connected to a contact 20 of the integrated circuit 12, while other sets 38 of a contact 22, line 24, contact 26, and solder ball 18 are electrically connected to a contact 20 of the integrated circuit 12.

According to the present invention, additional electrically conductive grounding contacts 28 are added to the package substrate 16, which grounding contacts 28 are electrically connected to an electrically conductive ground plane 32 within the package substrate 16, such as by electrically conductive connections 34. The grounding contacts 28 are most preferably disposed adjacent each of the contacts 26 on the lower surface of the package substrate 16. However, not all of the grounding contacts 28 are used, or alternately not the same set of grounding contacts 28 is used for each of the different integrated circuit 12 designs that can work with the standardized package substrate 16.

Most preferably, only those grounding contacts 28 which are disposed adjacent an unused set 36 of contact 22, line 24, contact 26, and solder ball 18 are used. These grounding contacts 28 are preferably used by electrically connecting the contact 26 of an unused set 36 with the grounding contact 28 associated with it. This is most preferably accomplished by modifying the solder mask used in conjunction with the solder balls 18 for a given integrated circuit 12, such that an additional amount of solder 30 is disposed for the unused sets 36, thus bridging or shorting the contact 26 to the grounding contact 28. In this manner, the unused set 36 of contact 22, line 24, contact 26, and solder ball 18 is electrically grounded through the grounding contact 28 to the ground plane 32 of the package substrate 16. Thus, any charges which might accumulate on the unused set 36 are readily shunted to ground before they can develop a potential difference which can discharge through an electrostatic discharge and damage the packaged integrated circuit 10.

In a preferred embodiment, the grounding contacts 28 are smaller than the contacts 26, and most preferably are between about one hundred microns and about two hundred microns in diameter. Preferably, the grounding contacts 28 are disposed from the contacts 26 at a distance of between about two hundred microns and about three hundred microns. In one embodiment, there is not a dedicated grounding contact 28 for each contact 26. Instead, there are grounding contacts 28 disposed interstitially with the contacts 28, where there is a lesser number of grounding contacts 28 than there are contacts 26. In this embodiment multiple contacts 28 in unused sets 36 are shorted to a given grounding contact 28.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A package substrate adapted to receive at least one subject integrated circuit having a subject contact pattern, where the subject integrated circuit is selected from a design set of integrated circuits, the package substrate comprising:
   an upper surface having electrically conductive bump contacts in a bump array, where the bump array is configured to provide electrical connections to all possible integrated circuit contact patterns in the design set of integrated circuits,
   a lower surface having electrically conductive ball contacts in a ball array, where one each of the bump contacts is electrically connected to one each of the ball contacts through the package substrate,
   an electrically conductive ground plane disposed between the upper surface and the lower surface, and
   grounding contacts disposed adjacent the ball contacts, where the grounding contacts are electrically connected to the ground plane, the grounding contacts adapted to electrically short a given ball contact to the ground plane when the bump contact electrically connected to the given ball contact is not used by the subject contact pattern of the subject integrated circuit, and wherein there is one each of the grounding contacts associated with one each of the ball contacts.

2. The package substrate of claim 1, wherein the grounding contacts are smaller than the ball contacts.

3. The package substrate of claim 1, wherein the grounding contacts are between about one hundred microns and about two hundred microns in diameter.

4. The package substrate of claim 1, wherein the grounding contacts are electrically connected to the ground plane with electrically conductive via in pad connections.

5. The package substrate of claim 1, wherein the grounding contacts are disposed from the ball contacts at a distance of between about two hundred microns and about three hundred microns.

6. A packaged integrated circuit including the package substrate of claim 1.

7. A packaged integrated circuit, comprising:
   a subject integrated circuit having a subject contact pattern, where the subject integrated circuit is selected from a design set of integrated circuits, and
   a package substrate adapted to receive the subject integrated circuit, the package substrate having,
      an upper surface having electrically conductive bump contacts in a bump array, where the bump array is configured to provide electrical connections to all possible integrated circuit contact patterns in the design set of integrated circuits,
      a lower surface having electrically conductive ball contacts in a ball array, where one each of the bump contacts is electrically connected to one each of the ball contacts through the package substrate,
      an electrically conductive ground plane disposed between the upper surface and the lower surface, and
      grounding contacts disposed adjacent the ball contacts, where the grounding contacts are electrically connected to the ground plane, the grounding contacts adapted to electrically short a given ball contact to the ground plane when the bump contact electrically connected to the given ball contact is not used by the subject contact pattern of the subject integrated circuit, and wherein there is one each of the grounding contacts associated with one each of the ball contacts.

8. The packaged integrated circuit of claim 7, wherein the grounding contacts are smaller than the ball contacts.

9. The packaged integrated circuit of claim 7, wherein the grounding contacts are between about one hundred microns and about two hundred microns in diameter.

10. The packaged integrated circuit of claim 7, wherein the grounding contacts are electrically connected to the ground plane with electrically conductive via in pad connections.

11. The packaged integrated circuit of claim 7, wherein the grounding contacts are disposed from the ball contacts at a distance of between about two hundred microns and about three hundred microns.

12. A method of packaging an integrated circuit with a package substrate to produce a packaged integrated circuit, in a manner so as to reduce the incidence of electrostatic discharge within the packaged integrated circuit, the method comprising the steps of:
   electrically connecting contacts on the integrated circuit to electrically conductive bump contacts in a bump array on an upper surface of the package substrate, where a portion of the bump contacts in the bump array have no corresponding contacts on the integrated circuit to make electrical connections with,
   electrically connecting the bump contacts in the bump array to electrically conductive ball contacts in a ball array on a lower surface of the package substrate, where one each of the bump contacts is electrically connected to one each of the ball contacts through the package substrate, and electrically connecting the ball contacts that are electrically connected to the portion of the bump contacts that have no corresponding contacts on the integrated circuit to an electrically conductive ground plane disposed between the upper surface and the lower surface of the package substrate through grounding contacts disposed adjacent the ball contacts.

13. The method of claim 12, wherein the ball contacts that are electrically connected to the portion of the bump contacts that have no corresponding contacts on the integrated circuit are electrically connected to the electrically conductive ground plane through grounding contacts disposed adjacent the ball contacts on the lower surface of the package substrate.

14. The method of claim 13, wherein grounding contacts are disposed at a distance of between about two hundred microns and about three hundred microns from the ball contacts.

15. The method of claim 13, wherein grounding contacts are between about one hundred microns and about two hundred microns in diameter.

16. The method of claim 13, wherein the step of electrically connecting the ball contacts to the grounding contacts is accomplished by modifying the ball contacts in a solder mask, thereby allowing solder bridging to occur between the ball contacts and the grounding contacts.

* * * * *